United States Patent [19]

Tahara et al.

[11] Patent Number: 5,302,236

[45] Date of Patent: Apr. 12, 1994

[54] METHOD OF ETCHING OBJECT TO BE PROCESSED INCLUDING OXIDE OR NITRIDE PORTION

[75] Inventors: Yoshifumi Tahara, Yamato; Yoshihisa Hirano, Yokohama; Isahiro Hasegawa, Zushi; Keiji Horioka, Kawasaki, all of Japan

[73] Assignees: Tokyo Electron Limited, Tokyo; Kabushiki Kaisha Toshiba, Kawasaki, both of Japan

[21] Appl. No.: 779,376

[22] Filed: Oct. 18, 1991

[30] Foreign Application Priority Data

Oct. 19, 1990 [JP] Japan .................................. 2-283155
Nov. 5, 1990 [JP] Japan .................................. 2-300361

[51] Int. Cl.⁵ ................................................ H01L 21/00
[52] U.S. Cl. ................................... 156/643; 156/646; 156/653; 156/657; 156/662; 156/667; 204/192.35; 204/192.37
[58] Field of Search ............... 156/643, 646, 653, 657, 156/662, 667; 204/192.35, 192.37

[56] References Cited

U.S. PATENT DOCUMENTS

| | | | |
|---|---|---|---|
| 4,376,672 | 3/1983 | Wang et al. ............... | 156/643 |
| 4,582,581 | 4/1986 | Flanigan et al. . | |
| 4,654,112 | 3/1987 | Douglas et al. . | |
| 4,668,338 | 5/1987 | Maydan et al. ............. | 156/659.1 X |
| 4,786,361 | 11/1988 | Sekine et al. ............... | 156/345 X |
| 4,844,773 | 7/1989 | Loewenstein et al. ...... | 156/643 |

FOREIGN PATENT DOCUMENTS

| | | |
|---|---|---|
| 0065277 | 11/1982 | European Pat. Off. . |
| 0078161 | 5/1983 | European Pat. Off. . |
| 0140201 | 5/1985 | European Pat. Off. . |
| 0174249 | 3/1986 | European Pat. Off. . |
| 0283306 | 9/1988 | European Pat. Off. . |
| 53-41076 | 10/1978 | Japan . |
| 55-143560 | 11/1980 | Japan . |
| 56-158452 | 12/1981 | Japan . |
| 58-19476 | 2/1983 | Japan . |
| 61-256727 | 11/1986 | Japan . |
| 62-194623 | 8/1987 | Japan . |
| 39025 | 2/1989 | Japan ................... 156/345 |

OTHER PUBLICATIONS

Journal of American Society, vol. 106, No. 5, May 16, 1984, pp. 2787-2792, Keiko Takano, et al., "Quantum Chemical Interpretation of Oxidation Number as Applied to Carbon and Oxygen Compounds. Numbercial Analysis of the Electron Distribution with AB Initio Molecular Orbial Wave Functions".

Patent Abstracts of Japan, vol. 14, No. 151 (E-090) Mar. 22, 1990 & JP-A-02 010 726, Jan. 16, 1990, Sugino Shigeji: "Removal of Spontaneous Oxide Film on Surface of Semiconductor Substrate".

*Primary Examiner*—Thi Dang
*Attorney, Agent, or Firm*—Oblon, Spivak, McClelland, Maier & Neustadt

[57] ABSTRACT

According to this invention, a semiconductor wafer on which an oxide or nitride film is formed is loaded in a processing vessel, and when the oxide or nitride film of the semiconductor wafer is to be etched by a plasma of $CHF_3$ gas in the processing vessel, CO gas is present in the plasma atmosphere.

11 Claims, 9 Drawing Sheets

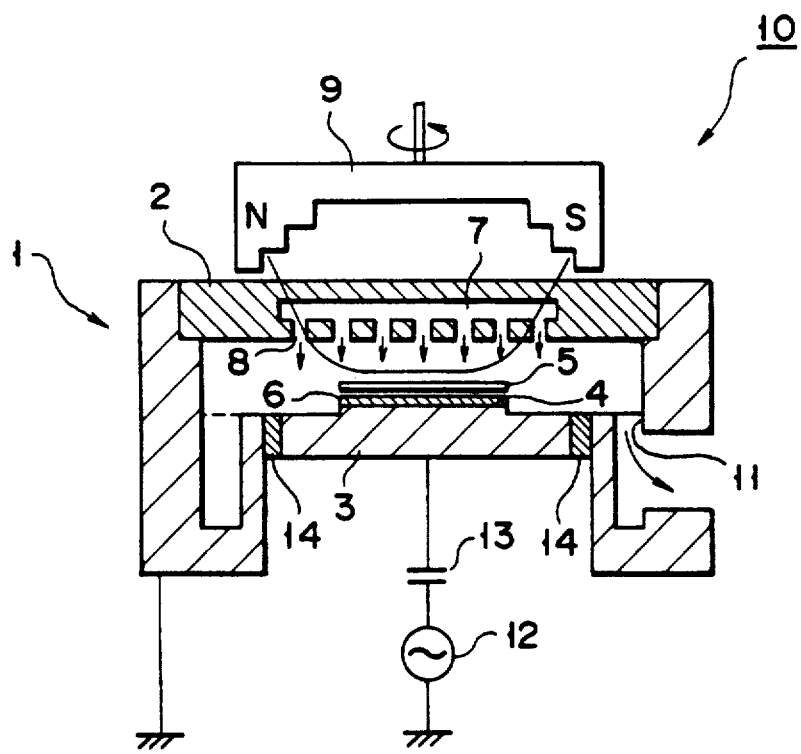
F I G. 1

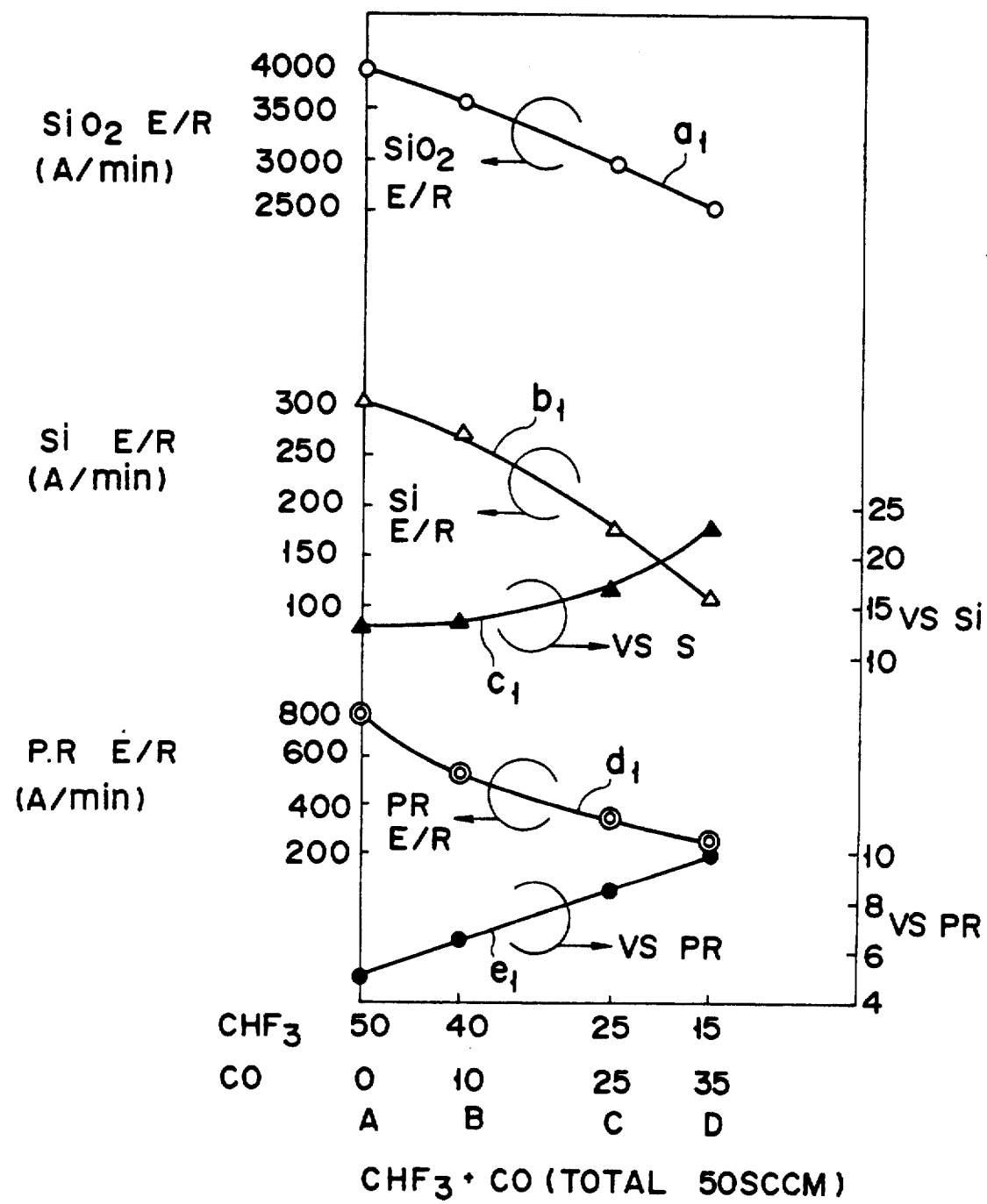
F I G. 4

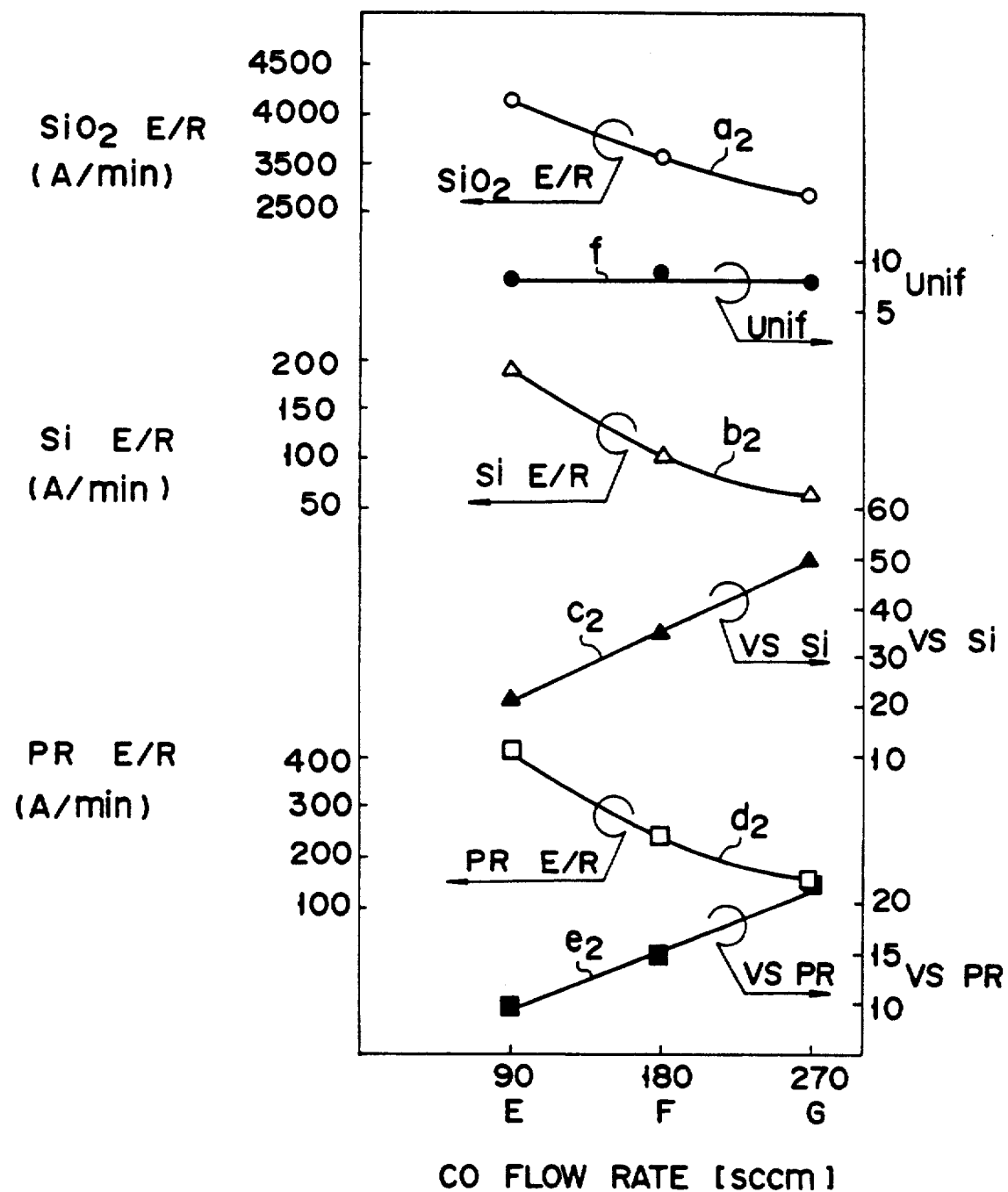
F I G. 6

| GAS RATIO | MEASUREMENT VALUE | CONTACT DIAMETER | | |
|---|---|---|---|---|
| | | 1.2 | 0.8 | 0.6 |
| A | $CHF_3/CO$ 50/0<br>E/R OF $SiO_2$<br>3911 Å/M<br>VS PR 5.1<br>VS Si 12.8 |  |  |  |
| B | $CHF_3/CO$ 40/10<br>E/R OF $SiO_2$<br>3576 Å/M<br>VS PR 6.7<br>VS Si 13.1 |  |  |  |
| C | $CHF_3/CO$ 25/25<br>E/R OF $SiO_2$<br>2973 Å/M<br>VS PR 8.5<br>VS Si 16.7 |  |  |  |
| D | $CHF_3/CO$ 15/35<br>E/R OF $SiO_2$<br>2545 Å/M<br>VS PR 10.0<br>VS Si 22.9 |  |  |  | ined under a low pressure (high vacuum)

METHOD OF ETCHING OBJECT TO BE PROCESSED INCLUDING OXIDE OR NITRIDE PORTION

BACKGROUND OF THE INVENTION

1. Field of the Invention

The present invention relates to a method of etching an object to be processed including oxide or nitride portion, for example a semiconductor element having oxide or nitride film.

2. Description of the Related Art

An integration density of an integrated circuit which is the core of the microelectronics has been increased year by year. As the integration density is increased, a pattern width is decreased, and a pattern depth is increased. In order to cope with this, a dry etching method performed under a low pressure (high vacuum) is developed (Published Unexamined Japanese Patent Application Nos. 61-256727 and 62-194623) as a thin film processing technique.

As the dry etching method, there are a plasma etching method, a sputter etching method, an ECR etching method, a magnetron etching method, and an ion beam etching method.

When a semiconductor element is processed by these dry etching methods, an etching rate is increased by using a gas containing a halogen element such as a Freon gas. For this reason, this method is applied to a reactive ion etching method (RIE). According to the RIE method, anisotropic etching can be performed while a ratio (selection ratio) of a etching rate of a sample to be etched to a etching rate of a photoresist is kept high. Since a high etching rate can be obtained, the productivity can be improved.

However, in a conventional RIE method, when an $SiO_2$ thin film which is an important material of a semiconductor element is to be etched to form a contact hole, a maximum selection ratio (a ratio of an etching rate (E/R) of an Si substrate to an etching rate of the $SiO_2$ film formed thereon) is a maximum of 13. This value indicates that the silicon substrate is etched at a 1/13 rate of the etching rate of the $SiO_2$ film after a contact hole is formed. Since the etching rate and the thickness of the $SiO_2$ have variations, an overetching process must be performed for a predetermined period to reliably form a contact hole. Therefore, the Si substrate is inevitably etched to some extent.

In a semiconductor element such as a MOSLSI element, as an integration density is increased, the depth of a p-n junction layer formed below a contact hole must be decreased. Therefore, etching is disadvantageously performed to an Si substrate to reach the p-n junction during an overetching process.

SUMMARY OF THE INVENTION

The present invention has been made in consideration of the above circumstances, and has as its object to provide a method of etching an object to be processed including oxide or nitride portion, wherein oxide and nitride portions can be preferably anisotropically etched at a high selection ratio with respect to a substrate, and a microloading effect, i.e., an effect of decreasing an etching depth in proportion to a decrease in an etching diameter, can be suppressed.

According to the present invention, there is provided a method of etching an object to be processed including oxide or nitride portion, comprising the steps of loading an object to be processed having an oxide or nitride portion into a processing vessel, and etching the oxide or nitride portion of the object to be processed by a gas plasma containing a halogen element in the processing vessel, wherein a gas containing both carbon in an oxidation state less than 4 and oxygen is present in an atmosphere of the gas plasma.

As described above, since the gas containing oxygen (O) and carbon (C) having an oxidation number of less than 4 is present in the plasma atmosphere, free radicals produced by decomposing a gas containing a halogen is produced, and carbon (C) is produced. Therefore, there is provided a etching method at a high selection ratio with high anisotropy while suppressing a microloading effect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing an arrangement of dry etching apparatus used for performing an etching method according to an embodiment of the present invention;

FIG. 4 is a graph showing relationships between a ratio of a $CHF_3$ flow rate to a CO flow rate, an etching rate of each thin film, and a selection ratio of a $SiO_2$ pattern layer to an Si substrate and a resist layer, when the method of the present invention is performed by the apparatus in FIG. 1 such that the ratio of the $CHF_3$ flow rate to the CO flow rate is varied while keeping a total flow rate of supplied $CHF_3$ gas and CO gas to be constant;

FIG. 6 is a graph showing relationships between a CO gas flow rate, an etching rate of each thin film, uniformity of etching for a $SiO_2$ pattern layer, and a selection ratio of the $SiO_2$ pattern layer to an Si substrate and a resist film, when the method of the present invention is performed by the apparatus in FIG. 1 such that the flow rate of supplied $CHF_3$ gas is constant and that the CO flow rate is changed;

DETAILED DESCRIPTION OF THE PREFERRED EMBODIMENTS

Figure 2A:
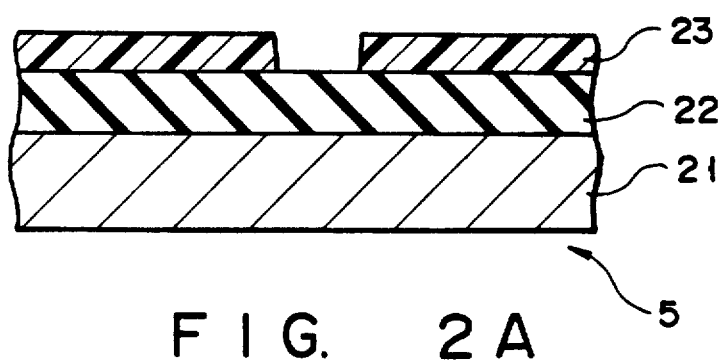
FIGS. 2A and 2B are views for explaining an etching step of a semiconductor wafer to be processed by the apparatus shown in FIG. 1.

According to the present invention, an oxide or nitride portion, for example an oxide or nitride film, of an object to be processed is etched by a gas plasma containing a halogen element, and a gas containing both carbon in an oxidation state less than 4 and oxygen is present in the plasma.

As a typical gas containing a halogen element, for example, a Freon gas (trade mark of E. I. Du Pont de Numerous & Inc: Fluorocarbon gas) (for example, $CHF_3$) is used. As a gas containing both carbon in an oxidation state less than 4 and oxygen, for example, carbon monoxide (CO) gas is used. These gases are introduced into a processing vessel, a vacuum atmosphere is formed in the vessel, and a plasma is produced by, e.g., a high frequency power source (RF power source). The plasma etches an oxide portion (e.g., an oxide film) or a nitride portion (e.g., a nitride film) of an object to be processed located in the vessel.

As a gas containing a halogen element, a Freon gas such as $CHF_3$ gas or $CBrF_3$ gas and a gas containing fluorine such as $SF_6$ gas, $NF_3$ gas, and $F_2$ gas can be preferably used. In addition, a gas containing another halogen element such as chlorine (Cl), bromine (Br), or iodine (I) can be used.

As a gas containing both carbon in an oxidation state less than 4 and oxygen, the CO gas is used as described above. In addition to the CO gas, COOH gas, HCHO gas, $CH_3COOH$ gas, or $CH_3OH$ gas can be preferably used. The gas is not limited to these compound gases. When both of O and C having an oxidation number of less than 4 are present, C and O may be independently supplied. For example, a C film is formed on the inner wall of the processing vessel, C gas is produced by etching the C film, and O is supplied, thereby allowing C and O to coexist.

When $CO_2$ gas containing C having an oxidation number of 4 is supplied, although verticality (anisotropy) is improved a selection ratio is undesirably decreased.

The following will be understood as a mechanism of the phenomenon as described above. When a gas containing both carbon in an oxidation state less than 4 and oxygen is present in a plasma atmosphere, free radicals generated by decomposing a gas containing a halogen element are reduced, and a reaction for producing C may occur. That is, for example, when etching is performed using $CHF_3$ as the halogen element and using CO gas as a gas containing both carbon in an oxidation state less than 4 and oxygen, it is deduced that $CF_2$ radicals produced by decomposing the $CHF_3$ in a plasma and added CO molecules are chemically reacted in the following reaction formula:

$$CF_2 + CO \rightarrow COF_2 + C$$

It is known that the $CF_2$ radicals are reactively polymerized to each other to form a fluorocarbon polymer, and that this polymer is easily deposited on the bottoms of small holes or on side walls thereof. Therefore, when $CF_2$ is reduced according to the above reaction, deposition of a polymer film is suppressed. As a result, verticality (anisotropy) of the etching is improved, and a microloading effect is suppressed.

A C film is formed on the exposed surface of a substrate by C produced by the above reaction, the substrate surface is protected, and etching of the substrate is suppressed. On an oxide film, since O produced by the etching reaction is bonded to C to produce CO or $CO_2$ gas, deposition of C is suppressed, and etching is rapidly performed. As a result, an etching selection ratio of the oxide film to the substrate is increased. Moreover, the C does not adversely affect the suppression of the microloading effect.

A Freon gas is used as a gas containing a halogen element, and CO gas is used as a gas containing both carbon in an oxidation state less than 4 and oxygen. In this state, the flow rate of the CO gas is preferably higher than that of the Freon gas.

An embodiment in which a method of the present invention is employed to a magnetron etching apparatus will be described below with reference to the accompanying drawings.

FIG. 1 is a schematic view showing an arrangement of a magnetron etching apparatus for performing the method of the present invention.

A magnetron etching apparatus 10 comprises a processing vessel 1, a pair of electrodes 2 and 3, a magnet 9, and a power source 12.

The processing vessel 1 is used for etching an object 5 to be processed, for example, a semiconductor wafer. The processing vessel 1 is evacuated by an evacuating means for example vacuum pump (not shown) through an exhaust port 11 arranged a lower side portion of the vessel 1, thereby keeping the processing vessel 1 to be vacuum. A pair of opposite electrodes are arranged in the processing vessel 1. For example, as shown in FIG. 1, the upper wall of the processing vessel 1 is used as the upper electrode 2, and the bottom wall is used as the lower electrode 3. The electrode 2 and the side wall of the vessel 1 are insulated from each other by an insulating member 14. The electrode 3 has a disk-like susceptor 4 on the upper center, and the object 5, for example, a semiconductor wafer, is supported on the susceptor 4. In order to reliably support the object 5 on the susceptor 4, a chuck mechanism, for example, an electrostatic chuck 6, is arranged on the susceptor to chuck the object 5.

A disk-like space 7 is formed opposite to the susceptor 4 inside the upper electrode 2, and a large number of gas diffusion holes 8 communicating with the space 7 and passing toward the processing vessel 1 are formed.

A gas supply tube (not shown) for supplying a process gas communicates with the space 7, and the process gas is supplied from the supply tube to the vessel 1 through the space 7 and the diffusion holes 8. A means for heating the process gas to an atmospheric temperature or more may be arranged as needed, and the process gas may be supplied through the heating means.

The magnet 9 for generating a magnetic field having a direction parallel to the surface of the object 5 is arranged above the upper electrode 2 outside the processing vessel 1. The magnet 9 is rotated at a predetermined rotational speed by a driving mechanism (not shown) such as a motor, thereby generating a uniform horizontal magnetic field above the surface of the object 5.

A temperature adjusting mechanism (not shown) capable of setting the temperature of the object 5 at a predetermined temperature (for example, $-150°$ C. to $300°$ C.) is arranged in the lower electrode 3.

The RF power source 12 is connected to the lower electrode 3 through a capacitor 13 and grounded. The power source 12 applies an RF power, for example, a power having a frequency of 13.56 MHz, between the upper electrode 2 and the lower electrode 3. At this time, although the RF power is applied to the lower electrode 3 using the upper electrode 2 as a ground electrode, the RF power may be applied to the upper electrode 3 using the lower electrode 2 as a ground electrode.

In order to etch the object 5 by the apparatus having the above arrangement, the object 5 is conveyed in the processing vessel 1 and is chucked on the electrostatic chuck 6. Thereafter, air in the processing vessel 1 is exhausted from the exhaust port 11 by a vacuum pump (not shown), and a degree of vacuum in the processing vessel 1 is set to be, for example, 10 Torr.

A process gas is supplied from the space 7 through the diffusion holes 8, and an RF power is applied between the upper electrode 2 and the lower electrode 3 by the power source 12. At this time, since a horizontal magnetic field is applied between the electrodes by the magnet 9, a horizontal magnetic field and an electric field perpendicular to the magnetic field are generated above the upper surface of the object 5, and a magnetron discharge is excited above the surface of the object 5. Since the magnet 9 is rotated, this magnetron discharge is uniformly excited. According to the magnetron discharge, electrons located between the electrodes are subjected to cyclotron movement to collide with molecules, and the number of ions is increased. Therefore, even at a relatively low pressure of $10^{-2}$ to $10^{-3}$ Torr, a high etching rate of 1 μm/min can be obtained.

In addition, by using this discharge, not only the etching process is performed at the low pressure, but more accurate vertical etching can be performed.

As the process gases, a gas containing a halogen element serving as an etching gas and a gas containing O and C having an oxidation number of less than 4 are used. As the etching gas, as described above, a gas containing fluorine, for example, $SF_6$ gas, $NF_3$ gas, $F_2$ gas, or a Freon gas such as $CHF_3$ gas or $CBrF_3$ gas, is preferably used. As a gas containing both carbon in an oxidation state less than 4 and oxygen, CO gas is preferably used.

Figure 2B:
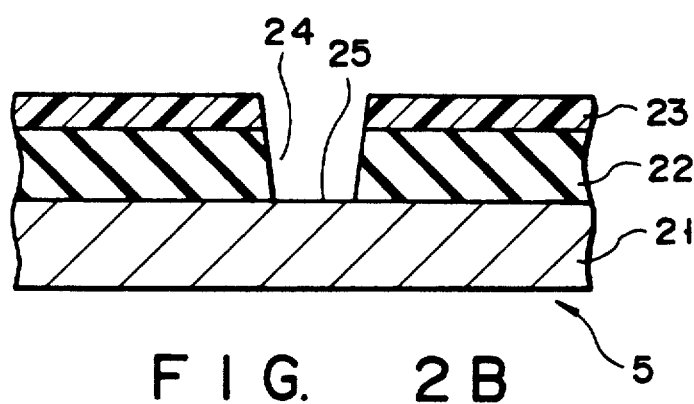

An etching pattern obtained by etching the object 5 (for example, a semiconductor wafer) using the etching apparatus 10 is formed, for example, as shown in FIGS. 2A and 2B. The object 5 used in this embodiment is obtained by forming an oxide film, for example, an $SiO_2$ film 22, on the surface of a semiconductor substrate, for example, an Si substrate 21 and forming a photoresist layer 23 on the $SiO_2$ film 22. As shown in FIG. 2A, the photoresist layer 23 is photoetched to form a mask, and a non-masked portion is etched to form an etching hole 24.

Figure 3A:
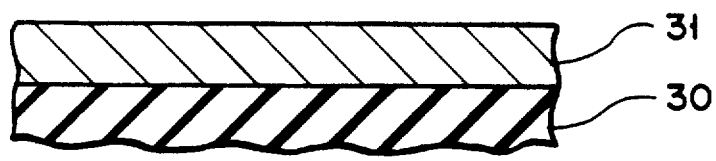
FIGS. 3A to 3D are views for another etching step.
Figure 3B:
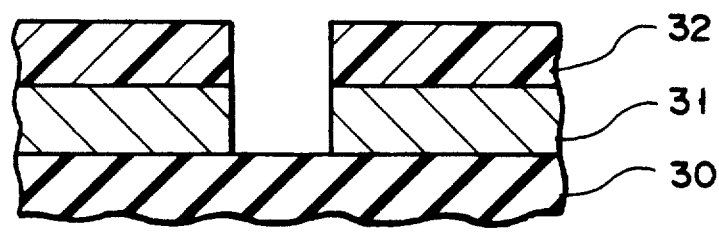
Figure 3C:
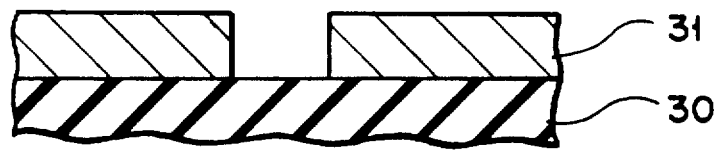
Figure 3D:
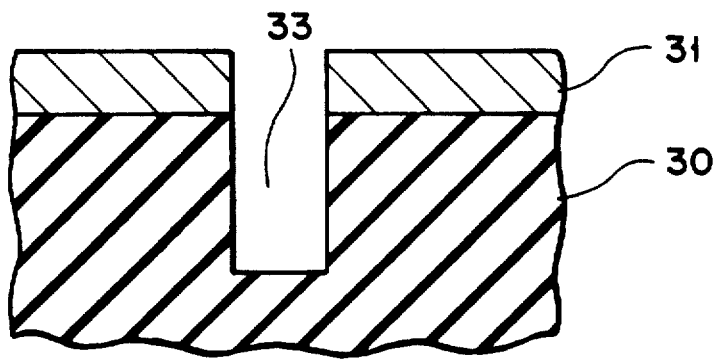

The present invention can be applied to not only an object to be processed obtained by forming an oxide or nitride film on a semiconductor substrate, but an object to be processed obtained by forming a semiconductor film on an oxide or nitride substrate. In this case, an etching process is shown in FIGS. 3A to 3D. As shown in FIG. 3A, a polysilicon film 31 is formed on an $SiO_2$ substrate 30. As shown in FIG. 3B, a resist film 32 is formed thereon, and the polysilicon film 31 is etched. As shown in FIG. 3C, the resist film 32 is removed. The etching method of the present invention is applied to the object to be processed prepared as described above, and, as shown in FIG. 3D, an etching hole 33 having a wall having high verticality can be formed in the $SiO_2$ substrate 30.

The etching method of the present invention can be employed, even when not only Si (monocrystalline) and $SiO_2$, but other materials such as polysilicon, WSi, MoSi, and TiSi are used as substrates of objects to be processed.

As a film to be etched, not only a single oxide film such as an $SiO_2$ film, but a single nitride film such as an SiN film can be used. The etching method of the present invention can also be applied to a stacked film constituted by an $SiO_2$ film and an SiN film and to an SiON film. In addition, the etching method can be applied to oxide and nitride films not containing Si, such as a $Ta_2O_5$ film, a $TiO_2$ film, and a TiN film.

The present invention can be applied to a general etching process for silicate glass containing an additive such as phosphorus or boron.

A result obtained by performing the above-described magnetron RIE according to the method of the present invention will be described below.

Using the apparatus shown in FIG. 1, the susceptor 4 having a diameter of 180 mm was used, a silicon wafer having the arrangement shown in FIG. 2B was placed on the susceptor 4 as the object 5. $CHF_3$ gas which is a Freon gas and CO gas were supplied in the space 7 as an etching gas and an additive gas, respectively. A gas mixture obtained by mixing these gases was diffused near the surface of the silicon wafer through the diffusion holes 8, and a pressure in the processing vessel 1 was set to be 40 Torr. While a magnetic field of 120 G was applied from the magnet 9, an RF power of 600 W was supplied from the RF power source 12 to generate a magnetron discharge. At this time, an etching process was performed by a plasma generated by the magnetron discharge.

FIG. 4 shows an etching rate (graph $a_1$) of the $SiO_2$ film, an etching rate (graph $b_1$) of the Si substrate 21, a selection ratio (graph $c_1$) of the $SiO_2$ film 22 to the substrate 21, an etching rate (graph $d_1$) of the resist 23 (P, R), and a selection ratio (graph $e_1$) of the $SiO_2$ film to the resist 23, when a supply ratio of $CHF_3$ gas to CO gas is varied (points A, B, C, and D).

Å/min is the unit for these etching rates. When a total supply rate is set to be 50 sccm, the supply ratio of the $CHF_3$ gas to the CO gas is set at 50:0 (indicated by point A), 40:10 (indicated by point B), 25:25 (indicated by point C), and 15:35 (indicated by point D). The etching rates and the selection ratios are plotted in correspondence with the above supply ratios.

The most important factor in an etching process is a high selection ratio of the $SiO_2$ pattern layer 22 to the Si substrate 21. As is apparent from FIG. 4, when conventional RIE is performed by supplying only $CHF_3$ gas, a selection ratio of the $SiO_2$ pattern layer to a Si substrate is 12.8 (point A in graph $C_1$). In contrast to this, it is apparent that selection ratios are increased at points B, C, and D where values obtained when CO gas is supplied are plotted. Especially, it is understood that considerably high selection ratios of the $SiO_2$ pattern layer to the Si substrate, i.e., 16. 7 and 22.9, can be respectively obtained at points C and D where values obtained when a CO gas supply rate is higher than a $CHF_3$ gas supply rate (a supply ratio of CO gas to $CHF_3$ gas is a ratio of 1:1 or more) are plotted.

A selection ratio (graph $e_1$) of the $SiO_2$ pattern layer to a resist layer (for example, borac photoresist) is linearly increased in proportion to the content of added CO gas. It is apparent that the value of point D is almost twice the value of point A at which CO gas addition is not performed.

As apparent from FIG. 4, the etching rate (graph $a_1$) of the $SiO_2$ pattern layer, the etching rate (graph $b_1$) of the Si substrate, and the etching rate (graph $d_1$) of the resist layer are linearly decreased in proportion to an increase in adding rate of CO gas.

The plotted values of the graphs ($a_1$, $c_1$, $d_1$, and $e_1$) except for graph $b_1$ in points A to D are shown in columns A to D of measurement values in FIG. 7 (to be described later).

Figure 5:
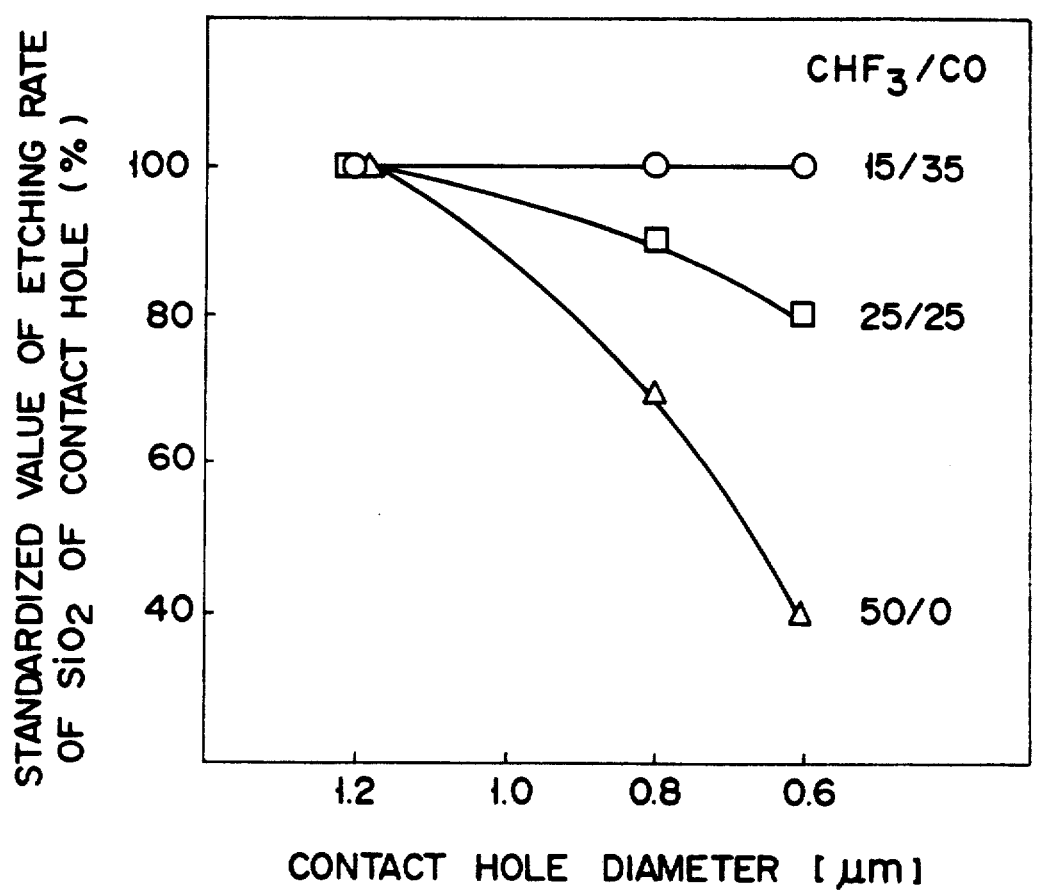
FIG. 5 is a graph showing a microloading effect when a $CHF_3$ gas flow rate and a CO gas flow rate are used as parameters.

FIG. 5 is a graph showing a result obtained by examining a microloading effect using a ratio of a $CHF_3$ flow rate to a CO gas flow rate as a parameter. This microloading effect means a decrease in value of $$\frac{\text{etching rate of each contact hole}}{\text{etching rate of scribing line}} \times 100 \ (\%)$$

in accordance with a decrease in contact hole diameter.

The abscissa in FIG. 5 shows an etching rate of $SiO_2$ of a contact hole standardized by an etching rate of $SiO_2$ of a scribing pattern portion having a width of 100 μm. The ordinate shows the size of the contact hole.

When $CHF_3$ : CO is 50 sccm : 0 sccm, the etching rate is decreased to 70% when a 0.8-μm pattern is used, and the etching rate is decreased to 40% when a 0.6-μm is used. In contrast to this, when $CHF_3$ : CO is 25 sccm : 25 sccm, the etching rate is increased to 90% when the 0.8-μm pattern is used, and the etching rate is increased to 80% when the 0.6-μm is used. In addition, when $CHF_3$ : CO is 15 sccm : 35 sccm, the etching rate is not dependent on a pattern size. Therefore, it is confirmed that the microloading effect disappears.

FIG. 6 shows an etching rate (graph $a_2$) of a $SiO_2$ pattern layer, uniformity (graph f: indicated by percentage) of the etching rate of the $SiO_2$ pattern layer, an etching rate (graph $b_2$) of an Si substrate, a selection ratio (graph $c_2$) of the $SiO_2$ pattern layer to the Si substrate, an etching rate (graph $d_2$) of a resist layer, and a selection ratio (graph $e_2$) of the $SiO_2$ pattern layer to the resist layer, when a CHF3 flow rate is set to be constant (90 sccm) and a CO flow rate is set at 90 sccm (indicated by point E), 180 sccm (indicated by point F), and 270 sccm (indicated by point G).

The state of each graph in FIG. 6 is similar to the state of each graph in FIG. 4. When a CO flow rate is increased with respect to a $CHF_3$ flow rate, although the etching rate (graph $a_2$) of the $SiO_2$ layer, the etching rate (graph $b_2$) of the Si substrate, and the etching rate (graph $d_2$) of the resist layer are almost linearly decreased, the selection ratio (graph $c_2$) of the pattern layer to the Si substrate, and a selection ratio (graph $e_2$) of the $SiO_2$ layer to the resist layer are linearly increased. Especially in graph $c_2$, although the value of the selection ratio is 12.8 (measurement value at point A in FIG. 4) when only $CHF_3$ gas is supplied, when CO gas is supplied at the same flow rate as that of $CHF_3$ gas, the selection ratio becomes 20. In addition, when CO gas is supplied at a flow rate two or three times of that of $CHF_3$ gas, the selection ratio is further increased. As a result, it is confirmed that CO gas is preferably supplied at a flow rate not less than the flow rate of $CHF_3$ gas (ratio of 1:1 or more). As is apparent from graph f, even when a flow rate of CO gas is increased, the uniformity of the etching rate of the $SiO_2$ layer is not changed.

When silicate glass containing boron and phosphorus was etched under an etching condition of point F in FIG. 6, an etching rate of 4,400 Å/min could be obtained, and a selection ratio of the silicate glass to an Si substrate reached 57.

Figure 7:
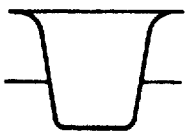
FIG. 7 is a view showing etching states when a contact diameter is changed at each measurement point in FIG. 4.
Figure 7:
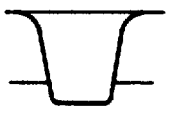
Figure 7:
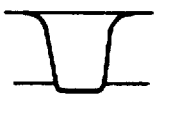
Figure 7:
Figure 7:
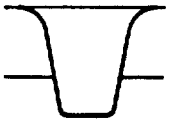
Figure 7:
Figure 7:
Figure 7:
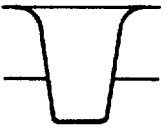
Figure 7:
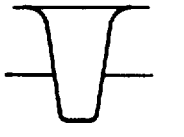
Figure 7:
Figure 7:
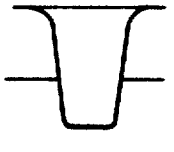
Figure 7:
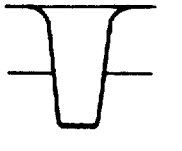

FIG. 7 shows measurement values of each gas ratio (points A to D) in FIG. 4 and etching conditions when a contact diameter (μm) is changed into three values, i.e., 1.2, 0.8, and 0.6 at each gas ratio. As is apparent from FIG. 7, when CO gas is supplied, even when the contact diameter is decreased, an etching depth is not changed, and a microloading effect, i.e., an effect for decreasing an etching depth in proportion to an decrease in an etching diameter, can be largely suppressed.

In this etching process, as described above, it is deduced that $CF_2$ radicals produced by decomposing $CHF_3$ molecules in a plasma and CO molecules are reacted with each other in the following reaction formula:

$$CF_2 + CO \rightarrow COF_2 + C$$

It is understood to reduce $CF_2$ radicals which are polymerized to each other to form a fluorocarbon polymer. Therefore, deposition of the polymer formed as described above on the bottoms or side walls of small holes can be suppressed, verticality of etching can be improved, and a microloading effect can be suppressed.

Carbon (C) generated by the above reaction forms a C film 25 on the surface of the Si substrate exposed by etching as shown in FIG. 2B. The surface of the Si substrate is protected by the C film 25, and etching of the Si substrate is suppressed. On the $SiO_2$ film, since CO or $CO_2$ is generated by bonding oxygen to carbon generated by an etching reaction of $SiO_2$, deposition of carbon is suppressed, and etching is rapidly performed. As a result, a selection ratio of the $SiO_2$ film to the Si substrate is increased.

Figure 8:
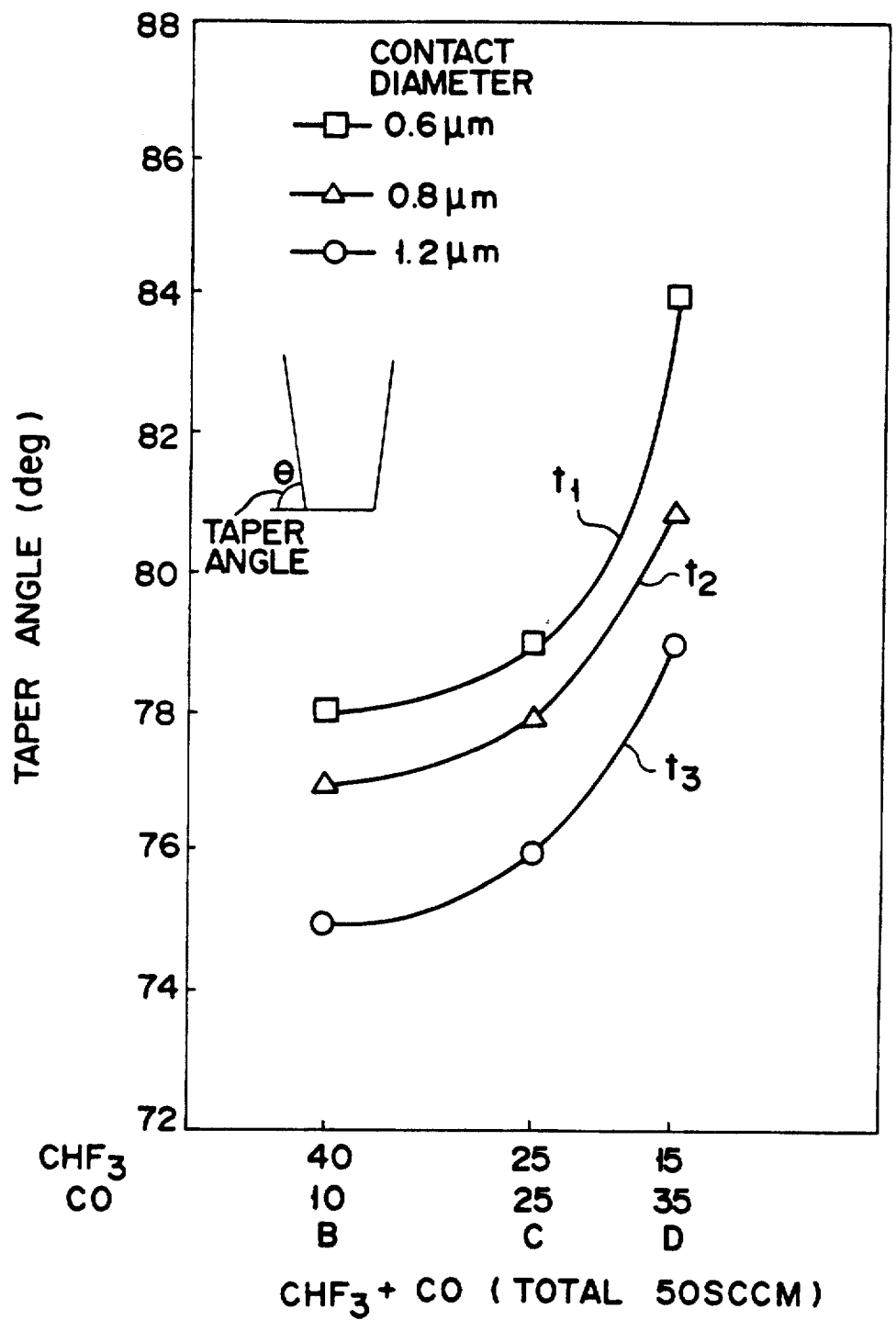
FIG. 8 is a graph showing taper angles when the etching shown in FIG. 7 is performed.

FIG. 8 shows etching taper angles (slope of a side wall of an etching groove portion : $\theta$ in FIG. 8) in points A to D in FIG. 7. In FIG. 8, when a contact diameter is set to be 0.6, 0.8, and 1.2 μm, taper angles in points B to D are shown in graphs $t_1$, $t_2$, and $t_3$, respectively. According to the graphs, it is understood that the taper angles ar increased in proportion to an increase in CO flow rate. As is apparent from FIG. 8, especially when a CO flow rate is set to be a $CHF_3$ flow rate or more, a taper angle is largely increased, and verticality (anisotropy) of a hole formed by an etching process is improved.

Figure 9:
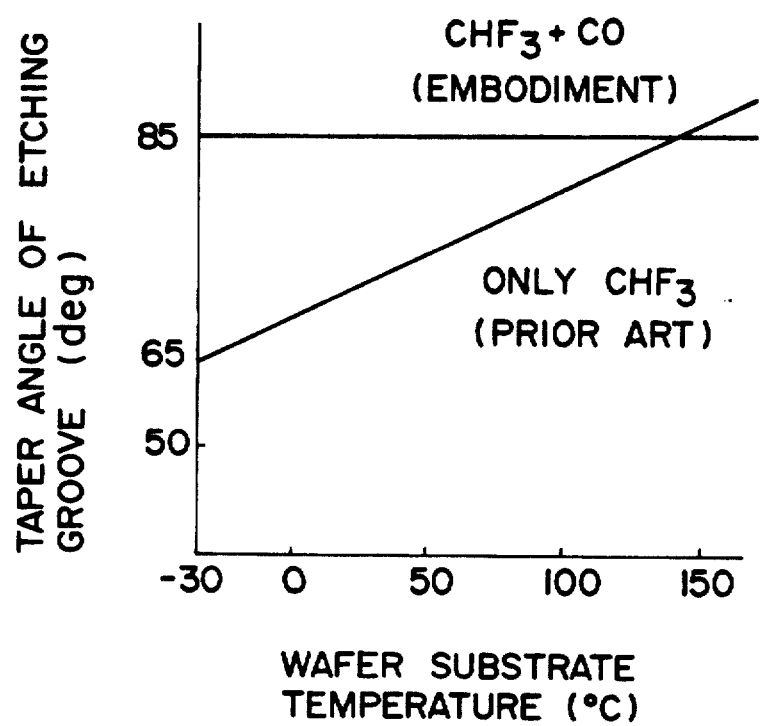
FIG. 9 is a graph showing a change in taper angle of an etching groove as a function of a wafer temperature according to the method of the present invention.

FIG. 9 is a change in taper angle $\theta$ of an etching groove when the temperature of the wafer shown in FIG. 2B is changed within a range from $-30°$ C. to $150°$ C. As is apparent from FIG. 9, when $CHF_3 + CO$ (gas ratio: D; contact diameter: 0.6 μm) are supplied according to the embodiment of the present invention, even when the wafer temperature is changed, a taper angle $\theta$ representing an almost vertical wall can be stably obtained. In contrast to this, when only $CHF_3$ (contact diameter: 0.6 μm) is supplied according to a conventional technique, a taper angle $\theta$ is largely changed depending on the wafer temperature.

As described above, verticality of an etching groove is improved according to the method of the present invention. This improvement is achieved by an effect of a gas containing both carbon in an oxidation state less than 4 and oxygen.

The C film formed in this embodiment must be removed after the etching process. The C film may be removed by any of methods the C film can be simultaneously removed by an ashing step for removing the resist layer 23 shown in FIG. 2A.

The etching process performed by the above-described magnetron plasma etching apparatus may be performed under not only the above condition but various conditions. For example, a pressure in a processing vessel is preferably set within a range from 5 to 300 Torr. An input power is changed in accordance with the size of a susceptor. A power of 200 to 1500 W is applied as the input power. In addition, a magnet is set to generate a magnetic field of about 30 to 300 G.

A magnetron plasma etching process has been described in the above embodiment. However, the present invention can be applied to any dry etching such as ECR etching, RIE, and normal plasma etching.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A method of etching an object to be processed which contains at least an oxide or nitride portion, and a substrate which comprises:
   introducing an object to be processed into a processing vessel,
   introducing into the processing vessel a stream of carbon monoxide gas and a stream of fluorine-containing gas, wherein the flow rate of said stream of carbon monoxide gas is sufficiently greater than the flow rate of said fluorine-containing gas to achieve a plasma characterized by an etch rate of the oxide or nitride portion of a selectivity ratio of at least 20 with respect to the substrate.

2. The method of claim 1, wherein the fluorine-containing gas is selected from group consisting of $CHF_3$, $CBrF_3$, $SF_6$, $NF_3$ and $F_2$.

3. The method according to claim 1, wherein said object to be processed includes a semiconductor substrate and said oxide or nitride portion formed thereon.

4. The method of claim 1, wherein said substrate of said object to be processed includes an oxide or nitride portion and a semiconductor film formed thereon.

5. The method according to claim 1, wherein the step of etching comprises the step of etching performed by a magnetron plasma etching apparatus.

6. The method according to claim 5, wherein the step of etching is performed under a reduced pressure of $10^{-2}$ to $10^{-3}$ Torr.

7. The method according to claim 5, wherein said magnetron plasma etching apparatus rotates a permanent magnet so as to apply a magnetic field to the plasma-generating region.

8. The method according to claim 1, wherein said oxide or nitride portion consists of $SiO_2$, $SiN$, $Ta_2O_5$, $TiO_2$ or $TiN$.

9. The method according to claim 1, wherein the flow rate of said gas containing carbon having an oxidation number of less than 4 and oxygen is 2 to 3 times that of said fluorine-containing gas.

10. The method of claim 1, wherein the fluorine-containing gas is $CHF_3$.

11. The method of claim 1, wherein said fluorine-containing gas is $CHF_3$ and CO is present in said gas plasma in an amount of at least 75%.

* * * * *